United States Patent
Hebig et al.

(10) Patent No.: US 9,299,451 B2
(45) Date of Patent: Mar. 29, 2016

(54) TAMPER RESISTANT ELECTRONIC SYSTEM UTILIZING ACCEPTABLE TAMPER THRESHOLD COUNT

(75) Inventors: Travis R. Hebig, Rochester, MN (US); Joseph Kuczynski, Rochester, MN (US); Robert E. Meyer, III, Rochester, MN (US); Steven R. Nickel, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 410 days.

(21) Appl. No.: 13/354,657

(22) Filed: Jan. 20, 2012

(65) Prior Publication Data

US 2013/0187706 A1 Jul. 25, 2013

(51) Int. Cl.
*H01H 31/02* (2006.01)
*G11C 17/18* (2006.01)
*G11C 17/16* (2006.01)
*H04W 4/00* (2009.01)

(52) U.S. Cl.
CPC ................ *G11C 17/18* (2013.01); *G11C 17/16* (2013.01); *G06F 2201/00* (2013.01); *G06F 2203/00* (2013.01); *H04W 4/00* (2013.01)

(58) Field of Classification Search
USPC ........................................................ 324/555
See application file for complete search history.

(56) References Cited

U.S. PATENT DOCUMENTS

| | | | |
|---|---|---|---|
| 5,406,630 A | 4/1995 | Piosenka et al. | |
| 5,659,454 A * | 8/1997 | Vermesse | 361/104 |
| 6,217,213 B1 | 4/2001 | Curry et al. | |
| 7,223,964 B2 | 5/2007 | Wiese et al. | |
| 7,362,248 B2 | 4/2008 | McClure et al. | |
| 7,385,491 B2 | 6/2008 | Doi | |
| 7,443,176 B2 | 10/2008 | McClure et al. | |
| 7,528,646 B2 * | 5/2009 | Aipperspach et al. | 327/525 |
| 7,573,301 B2 | 8/2009 | Walmsley | |
| 7,822,996 B2 | 10/2010 | Watts, Jr. | |
| 7,830,021 B1 | 11/2010 | Wilcoxon et al. | |
| 7,975,156 B2 | 7/2011 | Artman et al. | |
| 2005/0077878 A1 * | 4/2005 | Carrier | B25F 5/00 320/134 |
| 2006/0131743 A1 * | 6/2006 | Erickson | G06F 21/71 257/737 |
| 2006/0198206 A1 * | 9/2006 | Mishima | G11C 29/1201 324/754.27 |
| 2007/0210411 A1 * | 9/2007 | Hovis et al. | 257/529 |
| 2007/0300053 A1 * | 12/2007 | Dale et al. | 713/2 |
| 2008/0061816 A1 * | 3/2008 | Borkenhagen et al. | 326/8 |
| 2008/0061817 A1 * | 3/2008 | Erickson et al. | 326/8 |
| 2008/0143373 A1 * | 6/2008 | Bonaccio et al. | 326/8 |
| 2009/0115607 A1 * | 5/2009 | Beinhocker | 340/541 |

* cited by examiner

*Primary Examiner* — Huy Q Phan
*Assistant Examiner* — Temilade Rhodes-Vivour
(74) *Attorney, Agent, or Firm* — Matthew C. Zehrer

(57) ABSTRACT

A tamper resistant electronic device includes multiple eFuses that are individually blown in each instance the electronic device is tampered with. For example an eFuse is blown when the electronic device is subjected to a temperature that causes solder reflow. Since it is anticipated that the electronic device may be tampered with in an acceptable way and/or an acceptable number of instances, functionality of the electronic device is altered or disabled only after a threshold number of eFuses are blown. In certain implementations, the threshold number is the number of anticipated acceptable tamper events. Upon a tamper event an individual eFuse is blown. If the total number of blown eFuses is less than the threshold, a next eFuse is enabled so that it may be blown upon a next tamper event.

20 Claims, 11 Drawing Sheets

TAMPER RESISTANT ELECTRONIC SYSTEM UTILIZING ACCEPTABLE TAMPER THRESHOLD COUNT

FIELD OF THE INVENTION

Embodiments of the present invention relate to a tamper resistant electronic system utilizing an acceptable tamper threshold count.

DESCRIPTION OF THE RELATED ART

Traditional tamper resistant electronic systems may be used to store or process private, sensitive, or important, information, such as private keys or electronic money credit. To prevent an attacker from retrieving or modifying information, the electronic devices may be designed so that the information is not accessible through external means and can be accessed only by the embedded software that contains appropriate security measures.

It may be difficult to make simple electronic systems secure against tampering, because numerous attacks are possible, including: physical tampering (e.g., microprobing, drills, files, solvents, etc.), freezing, applying out-of-spec voltages or power surges, applying unusual clock signals, inducing software errors using radiation, measuring the precise time and power requirements of certain operations, etc.

To combat tampering, electronic systems increasingly require function to be disabled or modified after semiconductor chips used in the electronic systems have been manufactured or have been placed into commerce. After manufacture of the electronic system, eFuses can be blown to personalize the electronic system for a particular specific application or to disable or modify the electronic system functionality.

An eFuse is electronically programmable and may be programmed by blowing the eFuse after a chip or electronic system is manufactured. In many applications, the eFuse is blown even after an electronic system utilizing the chip has been in operation for some time.

An eFuse typically comprises a silicided polysilicon conductor. Silicide has been widely used in semiconductor products to reduce resistance of a polysilicon conductor, for example silicide has been utilized in polysilicon gates used in Field Effect Transistors (FETs), or a doped silicon region, such as a source or drain of a FET. An eFuse is blown by directing a current of sufficient magnitude and duration through the eFuse to remove, by melting or electromigration, at least a portion of the silicide between a first end and a second end of the eFuse. Removal of at least a portion of the silicide changes an electrical resistance between the first end and the second end of the eFuse. This change of resistance may be determined and the functionality of the electronic system may be enabled, disabled, or otherwise modified.

SUMMARY

In a first embodiment, a tamper resistant electronic system includes at least two eFuse systems (e.g., a thermo eFuse system and an eFuse system, etc.). The tamper resistant electric system further includes a thermoelectric device that converts thermal energy to electrical energy used to program the one or more thermo eFuses (i.e., eFuses blown by a thermoelectric device). A thermo eFuse blow monitor may also be included and may used to determine the number of programmed thermo eFuses. The tamper resistant electric system further includes an eFuse system that is associated with the thermo eFuse blow monitor that is enabled if the number of programmed thermo eFuses exceeds an acceptable threshold. When an eFuse system is programmed, functionality of the tamper resistant electronic system may be disabled, changed, enabled, etc. In certain implementations, the acceptable threshold is the number of anticipated acceptable tamper events.

Generally, the thermo eFuses are configured to blow upon tampering (e.g., heating of the tamper resistant electronic system, etc.). Therefore, the tamper resistant electronic system is tamper resistant since the eFuse system changes the functionality of the tamper resistant electronic system upon the requisite number of thermo eFuses being blown.

The thermoelectric device programs one or more of the thermo eFuses by converting thermal energy to electrical energy and the eFuses within the eFuse system are programmed with electrical energy supplied by the tamper resistant electronic system power supply. In this way, a thermo eFuse may be programmed when the power supply is not supplying power to the tamper resistant electronic system.

The thermoelectric device may utilize a temperature differential to generate electrical energy and may be configured to program the thermo eFuse if the thermoelectric device is exposed to a tampering such as a temperature greater than or equal to a solder reflow temperature. For instance, when the tamper resistant electronic system is inserted into a solder reflow oven, the thermoelectric device may utilize a temperature differential to generate electrical energy used to program the thermo eFuse. Therefore, the number of programmed thermo eFuses is indicative of whether the tamper resistant electronic system has been tampered with.

When power is supplied or restored to tamper resistant electronic system, a sense circuit may sense whether a thermo eFuse has been programmed. This sensing may occur during initialization of the tamper resistant electronic system. When it is sensed that a thermo eFuse has been programmed, the eFuse system may be programmed and functionality of the tamper resistant electronic system may be disabled, changed, enabled, etc.

In a second embodiment, a method for managing the programming of the eFuse system in a multiple eFuse system environment includes comparing a number of programmed thermo eFuses within a thermo eFuse system to an acceptable threshold, and if the number of programmed thermo eFuses is greater than the threshold, enabling the programming of the eFuse system.

The method may also include comparing the number of programmed thermo eFuses to a previous number of programmed thermo eFuses, and if the number of programmed thermo eFuses has increased relative to the previous number of programmed thermo eFuses, enabling the programming of the eFuse system.

The method may also include disabling functionality of a tamper resistant electronic system by programming the eFuse system or include enabling self destruct functionality of a tamper resistant electronic system by programming the eFuse system.

The method may also include programming a particular thermo eFuse if the thermoelectric device is exposed to a temperature greater than or equal to a solder reflow temperature or include sensing whether the particular thermo eFuse has been programmed during initialization of a tamper resistant electronic system.

In a third embodiment, a design structure, tangibly embodied in a machine readable medium, for designing, manufacturing, or testing an integrated circuit, includes a thermoelectric device that converts thermal energy to electrical energy used to program one or more thermo eFuses; a thermo eFuse blow monitor that determines the number of programmed thermo eFuses; and an eFuse system associated with the thermo eFuse blow monitor that is enabled if the number of programmed thermo eFuses exceeds an acceptable threshold. In certain implementations, the acceptable threshold is the number of anticipated acceptable tamper events.

The design structure may also include a netlist and may reside on storage medium as a data format used for the exchange of layout data of integrated circuits or may reside in a programmable gate array.

In a fourth embodiment, a tamper resistant electronic system includes only one eFuse system (e.g., a thermo eFuse system or an eFuse system, etc.). This tamper resistant electric system further includes a device that generates a tamper signal. In some implementations the tamper signal generating device may be a thermoelectric device. In other implementations, the tamper signal generating device may be a temperature sensor that outputs the tamper signal after the temperature sensor is subject to a threshold temperature a set number of acceptable instances. This tamper resistant electric system further includes a single set of eFuses that are individually enabled (e.g., one hot enabled, etc.) to be blown upon the receipt of the tamper signal by a blow system. The blow state of the single set of eFuses may be encoded and the encoded outputs may be in turn routed to a decoder that provides the enable signal to identify a particular eFuse to be blown. The outputs are read and functionality of the tamper resistant electronic system may be disabled if an acceptable threshold number of eFuses are blown. Therefore, the number of programmed eFuses is indicative of whether the tamper resistant electronic system has been tampered with. In certain implementations, the acceptable threshold is the number of anticipated acceptable tamper events.

In a fifth embodiment, a method for managing the programming an eFuse system in a single eFuse system environment includes enabling an eFuse within the eFuse system to be blown and blowing the enabled eFuse upon the receipt of a tamper signal.

The method may also include comparing the number of programmed eFuses to an acceptable threshold number, and if the number of programmed eFuses is greater than the threshold, outputting a disable tamper resistant electronic system signal that may disable functionality of the tamper resistant electronic system. If the number of programmed eFuses is less than the threshold, a next eFuse within the single eFuse system is enabled. In certain implementations, the acceptable threshold number is the number of anticipated acceptable tamper events.

DETAILED DESCRIPTION

Figure 1:
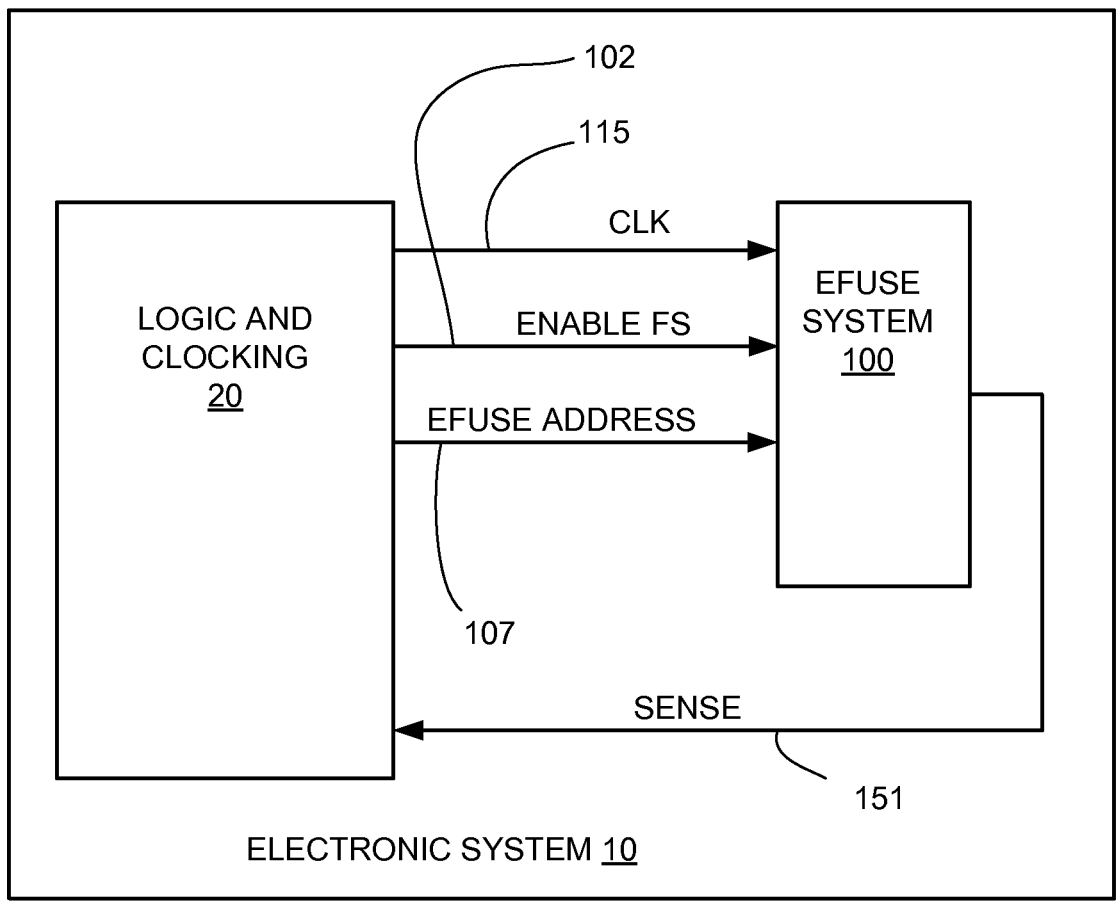
FIG. 1 depicts a prior art electronic system utilizing an eFuse system.

In the following detailed description, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

Embodiments of the present invention provide techniques and systems whereby operation of and/or access to particular features of an electronic device may be controlled or changed after the device has left the control of the manufacturer. The device may include a one or more non-volatile storage elements, such as eFuses or other one time programmable memories (e.g., EPROM, etc.), hereinafter referred collectively as eFuses. eFuses may be programmed (e.g., blown, etc.) in order to control or change the operation or functionality of an electronic system. Hereinafter, "blown" and "programmed" are used interchangeably.

In the following, reference is made to various embodiments of the invention. However, it should be understood that the invention is not limited to specific described embodiments. Instead, any combination of the following features and elements, whether related to different embodiments or not, is contemplated to implement and practice the invention. The following aspects, features, embodiments and advantages are merely illustrative and are not considered elements or limitations of the appended claims except where explicitly recited in a claim(s). Likewise, reference to the "invention" shall not be construed as a generalization of any inventive subject matter disclosed herein and shall not be considered to be an element or limitation of the appended claims except where explicitly recited in a claim(s).

eFuses generally operate in the following manner. A reference cell comprises a first circuitry configured to produce, when the first circuitry is connected to suitable voltage supplies, a reference current that passes through a reference resistance including a series connected unblown eFuse (not necessary in some embodiments) and resistor. The reference resistance is less than a resistance value of a blown eFuse on the same chip. The reference resistance is greater than a resistance of an unblown eFuse on the same chip. The reference cell produces a reference voltage determined by the reference current passing through the reference resistance.

The reference voltage is coupled to an eFuse cell, and is used in the eFuse cell by a second circuitry configured, when the second circuitry is connected to the suitable voltage supplies, to create a mirror of the reference current in the eFuse cell. The mirrored reference current is passed through an eFuse in the eFuse cell, producing an eFuse cell voltage output. The reference voltage is greater than an eFuse cell voltage output if the eFuse in the eFuse cell is unblown. The reference voltage is less than an eFuse cell voltage output if the eFuse in the eFuse cell is blown.

The eFuse cell voltage is compared with the reference voltage by a comparator; the comparator is operable when supplied by a suitable comparator supply voltage. An output of the comparator is a logical value responsive to whether an eFuse cell voltage output is greater than or less than the reference voltage.

Referring now to FIG. 1, an exemplary prior art electronic system 10 is shown. Electronic system 10 can be, for example, intended to explain but not limit, a processor, an ASIC (application specific integrated circuit) chip, a mobile phone, tablet computer, an electronic game system, or a server. Electronic system 10 comprises logic and clocking 20. Logic and clocking 20, in various electronic system 10 implementations may include (not shown) an ALU (arithmetic and logic unit), registers, SRAMs (static random access memory), DRAMs (dynamic random access memory), timers, control logic, and the like. Logic and clocking 20 further includes clocking circuitry that, in embodiments, may include phase locked loops, delay locked loops, and oscillators.

eFuse system 100 provides eFuses that can be blown under control of logic and clocking 20. Logic and clocking 20 provides an eFuse address 107 to eFuse system 100 which is used to address an eFuse that is to be blown. Logic and clocking 20 provides an ENABLE FS 102 signal that is used to place eFuse system 100 into a mode where eFuses can be blown. Logic and clocking 20 also sends a clock 115 to eFuse system 100. Clock 115 is used during programming (blowing) of eFuses in eFuse system 100. eFuse system 100 sends information regarding whether one or more eFuses are blown back to logic and clocking 20 on SENSE 151.

Figure 2:
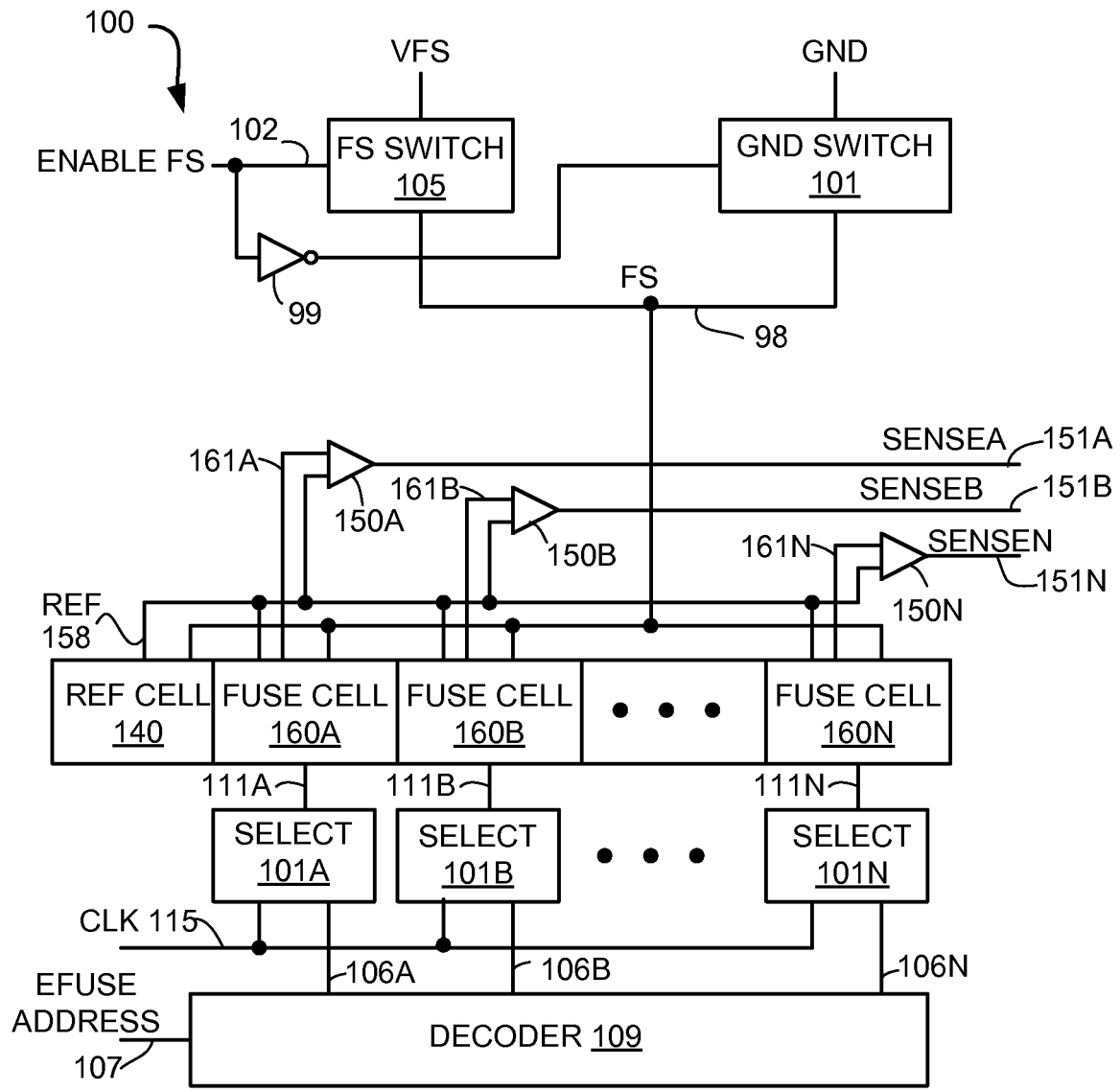
FIG. 2 depicts a prior art eFuse system.

Referring now to FIG. 2, prior art eFuse system 100 is shown in block diagram form. A reference cell 140 provides a reference voltage 158 that is distributed to one or more eFuse cells 160, shown as eFuse cells 160A-160N. A voltage supply VFS supplies a voltage, (e.g., 3.5 volts, a relatively high voltage, for current semiconductor technologies) that is connected to node SOURCE FS 98 when enable fuse source (ENABLE FS) 102 is active. The voltage supplied by VFS is suitable for blowing an eFuse in an eFuse cell 160. It is understood that, as eFuse technology advances, that VFS, in the future, may not be of significantly higher voltage than VDD. VFS, in fact, may actually be VDD in applications where VDD is of sufficient voltage to blow an eFuse. FS switch 105 must have a low enough electrical resistance to accommodate blowing an eFuse in an eFuse cell 160. In some embodiments, FS switch 105 is physically on the same chip as the remainder of eFuse system 100. In other embodiments, FS switch 105 is physically implemented off the chip and is mounted, e.g., on a card upon which the chip is mounted, with node SOURCE FS 98 being coupled onto the chip. Inverter 99 inverts ENABLE FS 102 to control GND switch 101 to couple SOURCE FS 98 to ground when ENABLE FS 102 is not controlling FS switch 105 to couple SOURCE FS 98 to VFS.

When ENABLE FS 102 is inactive, the VFS voltage supplied via FS Switch 105 to node source FS 98 is disconnected and node SOURCE FS 98 is connected to ground by GND Switch 101. GND switch 101 must be designed to withstand the voltage supplied from VFS through FS switch 105, in particular, if VFS is a higher voltage than VDD. For example, use of stacked NFETs with suitable voltages coupled to gates of the NFETs is a known way to provide switch capability while avoiding stress on any NFET. In some embodiments, GND switch 101 is physically on the same chip as the remainder of eFuse system 100. In other embodiments, GND switch 101 is physically implemented off the chip and is mounted, e.g., on a card upon which the chip is mounted, with node source FS 98 being coupled onto the chip. In a specific application, both FS switch 105 and GND switch 101 are physically implemented off the chip that the remainder of eFuse system 100 and source FS 98 is coupled onto the chip.

Each eFuse cell 160 produces an eFuse cell voltage output 161, shown in FIG. 2 as 161A-161N from eFuse cells 160A-160N, respectively. In FIG. 2, comparators 150A-150N each compare an eFuse cell voltage output 161 with the reference voltage and produces a logical "1" or a logical "0" responsive to whether the eFuse cell voltage output 161 input to a particular comparator 150 is greater than or less than the reference voltage 158. For example, comparator 150A compares eFuse cell voltage output 161A with reference voltage 158 and comparator 150A outputs a logical "1" if eFuse cell voltage output 161A is greater than reference voltage 158, signifying that the eFuse in eFuse cell 160A has been blown. If the eFuse in eFuse cell 160A has not been blown, eFuse cell voltage output 161A is less than reference voltage 158, and comparator 150A outputs a logical "0". Comparators 150A-150N are powered by a suitable comparator voltage supply. Typically, a comparator 150 on a chip is powered by VDD as a suitable comparator voltage supply, although other voltage supplies are contemplated. A comparator 150 has to have an operable input voltage range that accommodates reference voltage 158 and an eFuse cell voltage output.

Decoder 109 receives an eFuse address 107 and, responsive to a value driven on eFuse address 107, activates a select signal 106, shown as 106A-106N coupled to select circuits 101A-101N, respectively. Select circuits 101A-101N also receive a clock 115 that is activated when an eFuse cell 160 is to be programmed. For example, if decoder 109 receives an eFuse address 107 that is the address for eFuse cell 160A, then select signal 106A is activated to a "1". When clock 115 is activated ("1"), a signal 111A is driven active to eFuse cell 160A. Signals 111B-111N are inactive when signal 111A is selected. At the same time, ENABLE FS 102 is activated, causing FS switch 105 to couple voltage VFS to FS 98, and to prevent GND switch 101 from coupling source FS 98 to ground. An eFuse in eFuse cell 160A is blown when signal 111A is active at the same time that node SOURCE FS 98 is coupled to VFS by FS switch 105.

Figure 3:
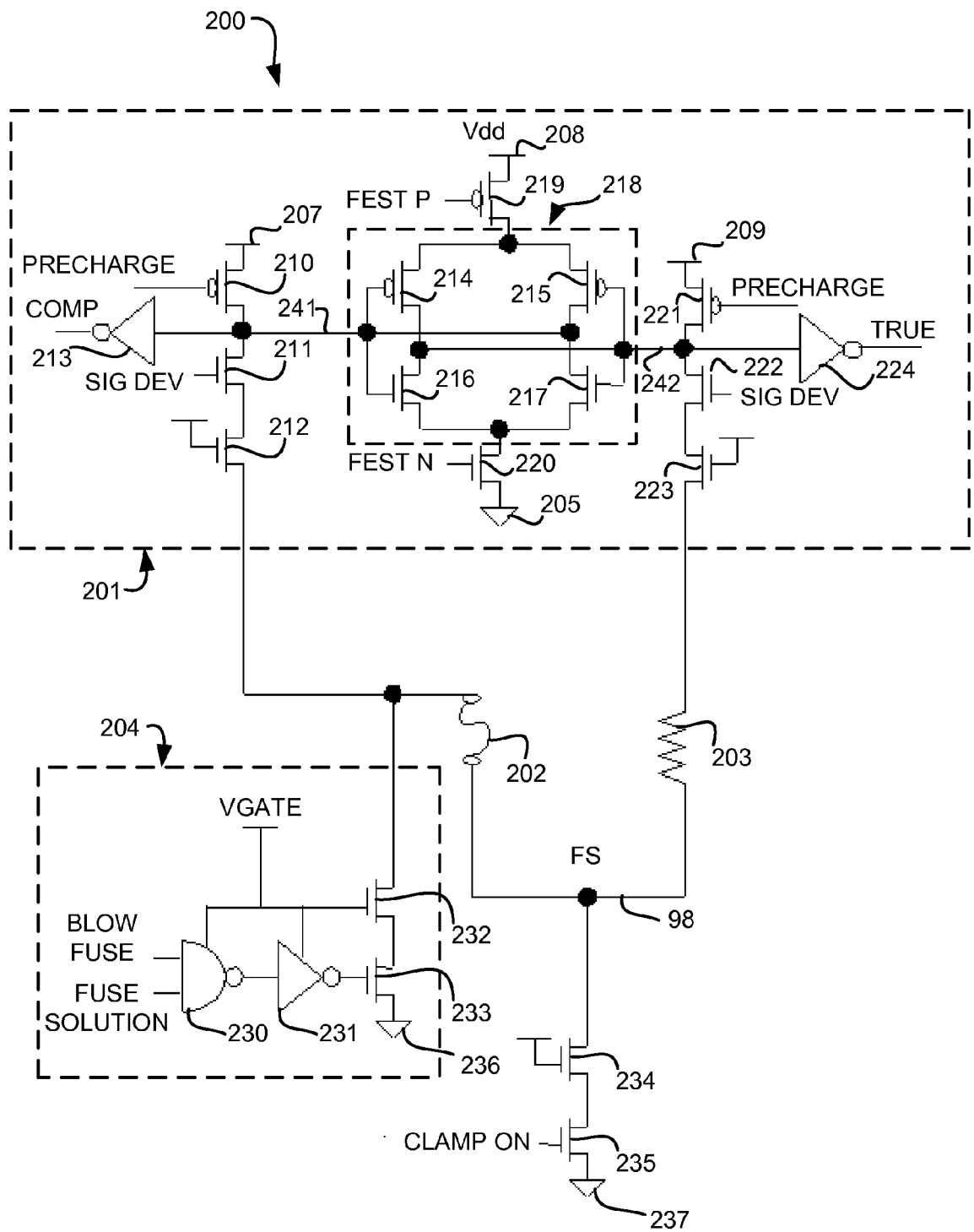
FIG. 3 depicts a prior art eFuse circuit.
Figure 4:
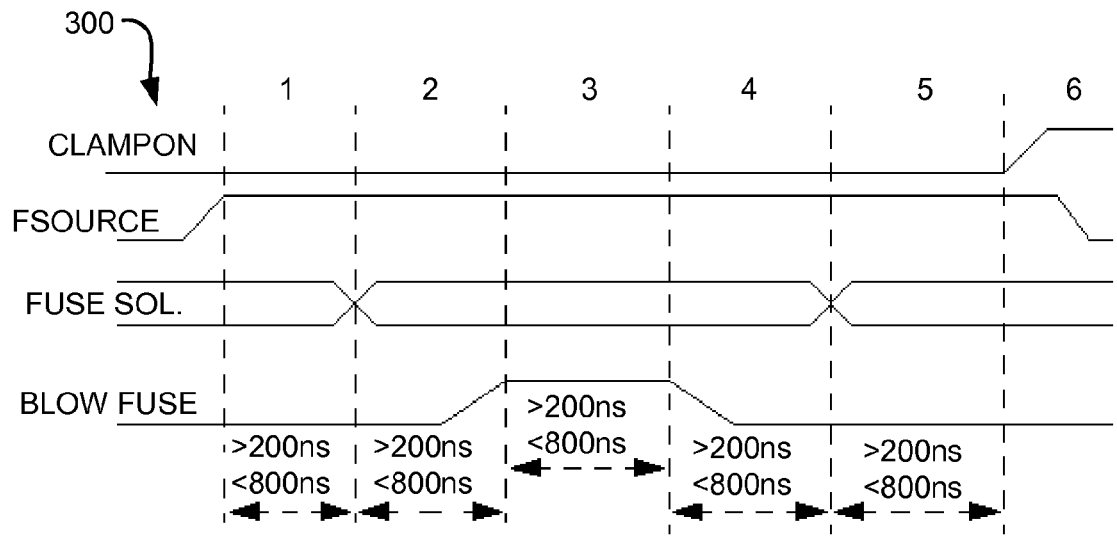
FIG. 4 depicts the prior art waveform process of blowing an eFuse.

Referring now to FIG. 3, an eFuse circuit 200 is depicted. eFuse circuit 200 includes sense circuitry 201, blow circuitry 204, eFuse link 202, reference resistor 203, source FS 98, NFETs 234 and 235, and ground 237. Blow circuitry 204 is supplied by voltage supply VGATE which for the purposes of embodiment 200 is the same magnitude as Vdd, the voltage supply for sense circuitry 201. In other embodiments however, VGATE and Vdd may be different magnitudes. The process of blowing eFuse link 202 is provided by waveform diagram 300 in FIG. 4, and herein described. In window 1, of FIG. 4, source FS 98 is brought high and held. In window 2 of FIG. 4, the state of FUSE SOLUTION is determined and held. The BLOW FUSE signal begins to rise toward the end of window 2. In window 3 of FIG. 4, BLOW FUSE is held high. If FUSE SOLUTION is also high, NAND gate 230 will output a '0'. The '0' is then inverted to a '1' by inverter 231 and passed to NFETs 232 and 233. Upon receipt of a '1', NFETs 232 and 233 are activated resulting in a path to ground 235 from source FS 98 through fuse link 202. eFuse link 202 is generally designed such that the current passing from source FS 98 though link 202 over a specified amount of time causes eFuse link 202 to blow (i.e., rupture, electrical migration of silicide, etc.) and become highly resistive as compared to the previous unblown state of link 202. In window 4 of FIG. 4, BLOW FUSE drops from a '1' to a '0' thereby closing the path from source FS 98 to ground 236. In window 5, of FIG. 4, FUSE SOLUTION is free to switch. Finally in window 6 of FIG. 4, CLAMP ON turns from a '0' to a '1' activating NFETs 234 and 235 resulting in a path from source FS 98 to ground 237.

Figure 5:
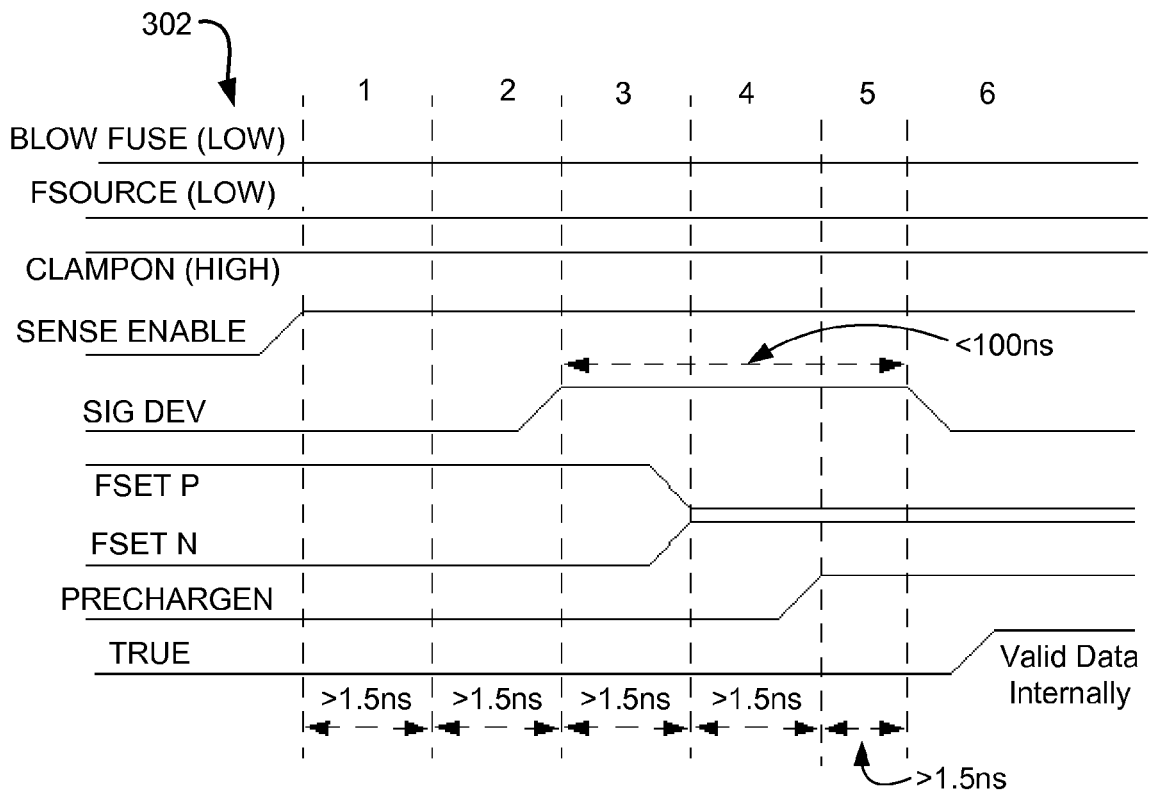
FIG. 5 depicts the prior art waveform process of sensing whether the eFuse has been blown.

The process of sensing whether eFuse link 202 has been blown is provided by waveform diagram 400 in FIG. 5, and herein described. In window 1 of FIG. 5, SENSE ENABLE goes high and is held. SENSE ENABLE generally is a sense enable signal allowing sense circuitry 201 to begin sensing whether eFuse link 202 has or has not been blown.

In window 2 of FIG. 5, SIG DEV rises activating NFETs 211 and 222 resulting in current through the two paths of the circuit. One path is through node 207, PFET 210, NFETs 211 and 212, eFuse link 202, NFETs 234 and 235, and finally to ground 237. The other path is through node 209, PFET 221, NFETs 222 and 223, reference resistor 203, NFETs 234 and 235, and finally to ground 237.

In window 3 of FIG. 5, FSET P and FSET N become active. This results in the voltage of node 241 and the voltage of node 242 to stabilize depending on the difference of resistance magnitudes of reference resistor 203 and eFuse link 202. If eFuse link 202 has not been blown, the resistance of eFuse link 202 is less than the resistance of reference resistor 203. This causes a lesser voltage at node 241 than the voltage at node 242. If eFuse link 202 has been blown, the voltage at node 241 is greater than the voltage at node 242.

In window 4 of FIG. 5, FSET P and FSET N are fully active thereby activating PFET 219 and NFET 220 and cross coupled inverter latch 215. Cross coupled inverter latch 218 generally amplifies the voltage difference between the voltage at node 241 and the voltage at node 242 to provide for more robust sensing capability.

In window 5 of FIG. 5, PRECHARGE switches high from a '0' to a '1' deactivating PFETs 210 and 221. In window 6 of FIG. 5, SIG DEV switches low from a '1' to a '0' deactivating NFETs 211 and 222. The process steps described in windows 5 and 6 isolate cross coupled inverter latch 218 from the outside influence of the two paths (i.e., node 207 through link 202, and node 209 through reference resistor 203). After SIG DEV switches low, from '1' to '0', the TRUE and COMP outputs reflect the state of cross coupled inverter latch 218. For example, when eFuse link 202 has been blown and cross coupled inverter latch 218 has been activated, a '1' is passed to inverter 213 and a '0' is passed to inverter 224. Inverter 213 and 224 then invert the signals, thereby resulting in COMP being low '0' and TRUE being high '1'. A separate latch (i.e., shadow latch), not shown in FIG. 3, stores the value of TRUE and COMP and is scannable (a latch part of a JTAG boundary scan chain, LSSD scan chain, etc).

Figure 6:
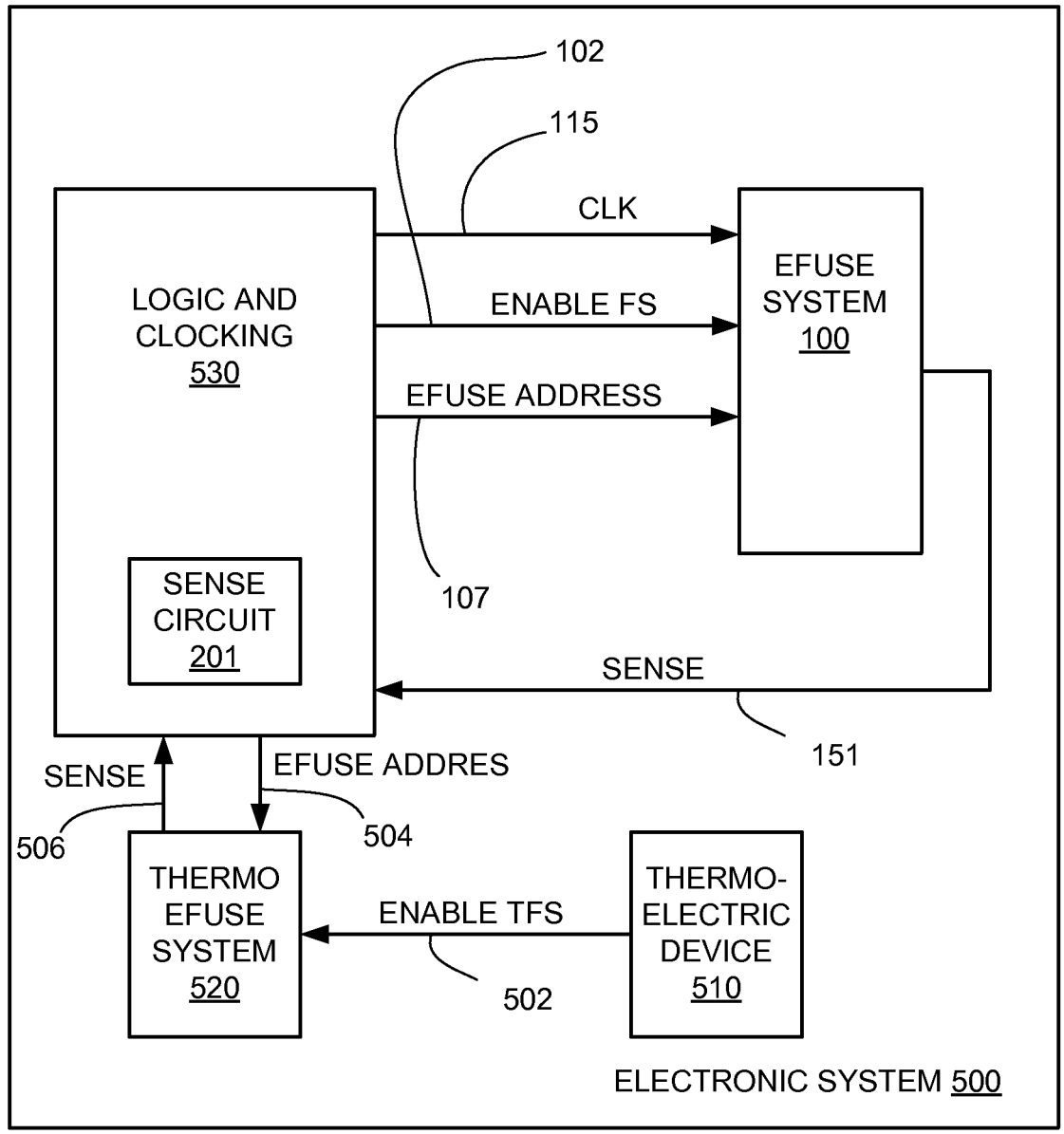
FIG. 6 depicts a tamper resistant electronic system that includes multiple eFuse environment (e.g., an eFuse system and a thermo eFuse system), a thermoelectric device, and logic and clocking according to embodiments of the present invention.

FIG. 6 depicts a tamper resistant electronic system 500 in a multiple eFuse system environment. Tamper resistant electronic system 500 includes at least two eFuse systems (e.g., an eFuse system 100 and a thermo eFuse system 520). Tamper resistant electronic system 500 further includes a thermoelectric device 510 and logic and clocking 530 according to embodiments of the present invention. Tamper resistant electronic system 500 can be, for example, intended to explain but not limit, a processor, an ASIC (application specific integrated circuit) chip, a motherboard assembly, a mobile phone, tablet computer, an electronic game system, or a server.

Tamper resistant electronic system 500 comprises thermoelectric device 510. Thermoelectric device 510 is a device that converts thermal energy to electric energy that is used to program one or more thermo eFuses 602. For example, thermoelectric device 510 creates a voltage when a temperature differential exists across portions of the thermoelectric device 510. In various embodiments, thermoelectric device 510 may be a Seebeck device, Peltier device, Thomson device, thermopile, or equivalent.

When thermal energy is converted to electric energy, thermoelectric device 510 provides a current to thermo eFuse system 520 that is utilized to program one or more thermo eFuses 602, via enable 502.

In various embodiments, thermal energy is provided to tamper resistant electronic system 500 by an external source. For example, during manufacture various components of tamper resistant electronic system 500 and/or the entire tamper resistant electronic system 500 is heated. In various embodiments, tamper resistant electronic system 500 may be heated in a reflow oven. A reflow oven is a machine used primarily to reflow solder used to connect electronic components to other electronic components. In other embodiments, a particular component of tamper resistant electronic system 500 is heated locally. For example an electrical component is heated by a soldering iron. A soldering iron is a tool that supplies heat to melt solder so that it can flow into the joint between two components.

During heating, temperature gradients exist across the object being heated. Therefore the temperatures across tamper resistant electronic system 500 and/or an individual component of tamper resistant electronic system 500 are not uniform. These temperature differentials may be utilized by thermoelectric device 510 to convert thermal energy to electrical energy.

Tamper resistant electronic system 500 comprises thermo eFuse system 520. Thermo eFuse system 520 is a device that includes a plurality of thermo eFuses 602. The plurality of thermo eFuses 602 may be separately, grouped, or globally programmed. The number of eFuses 602 that are programmed may be determined. Therefore, thermo eFuse system 520 may be utilized as a counter. For example, the number of eFuses 602 that are programmed within thermo eFuse system 520 may be determined by logic and clocking 530 (e.g., thermo eFuse blow monitor 621, sense circuit 201, etc.). For example, thermo eFuse system 520 sends information regarding whether one or more thermo eFuses 602 are blown back to logic and clocking 530 on SENSE 506.

Tamper resistant electronic system 500 comprises logic and clocking 530. Logic and clocking 530, in various tamper resistant electronic system 500 implementations may include (not shown) an ALU (arithmetic and logic unit), registers, SRAMs (static random access memory), DRAMs (dynamic random access memory), timers, control logic, and the like. Logic and clocking 530 further includes clocking circuitry that, in various embodiments, may include phase locked loops, delay locked loops, and oscillators.

Logic and clocking 530 provides a thermo eFuse address 504 to thermo eFuse system 520 to enable a thermo-eFuse that is to be blown. Further, Logic and clocking 530 monitors the number of thermo-eFuses 602 that are blown. If the number of blown thermo-eFuses 602 exceeds a threshold, Logic and clocking 530 provides an ENABLE FS 102 signal that is used to place eFuse system 100 into a mode where eFuses can be blown. In various embodiments, logic and clocking 530 may include sense circuit 201 for sensing whether a thermo eFuse 602 has been programmed and/or may include a thermo eFuse blow monitor 621 that stores an indication whether thermo eFuses 602 are or are not programmed.

Logic and clocking 530 may also send a clock 115 to eFuse system 100. Clock 115 is used during programming (blowing) of eFuses in eFuse system 100. eFuse system 100 sends information regarding whether one or more eFuses are blown back to logic and clocking 530 on SENSE 151. Therefore, in some implementations logic and clocking 530 is similar to logic and clocking 20, but with additional features and functionality as is described herein.

Tamper resistant electronic system 500 also includes a power supply (not shown) that supplies power to one or more devices of tamper resistant electronic system (e.g., processor, memory, eFuse system 100, etc.). Therefore, the eFuses links 202 within the eFuse system 100 are programmed with electrical energy supplied by the tamper resistant electronic system 500 power supply. Because the thermo eFuse 602 is programmed utilizing electrical energy generated by thermoelectric device 510, the thermo eFuses 602 may be programmed when the power supply is not supplying power to the tamper resistant electronic system 500.

Figure 7:
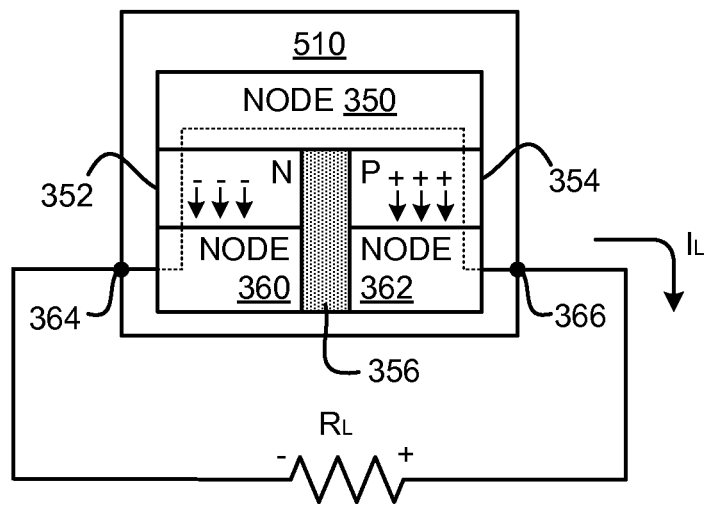
FIG. 7 depicts a thermoelectric device according to embodiments of the present invention.

FIG. 7 depicts a thermoelectric device 510 according to embodiments of the present invention. In various implementations, thermoelectric device 510 generates electric potential utilizing the thermoelectric effect: charge carriers in materials diffuse when one node of a conductor differs in temperature than another node. When heated carriers diffuse from a hot portion to a cold portion, the movement of heat from one end to the other is a heat current and an electric current (since charge carriers are moving).

For example, thermoelectric device 510 includes a node 350, a n-type material 353, a p-type material 354, a node 360, and a node 362. Though only a single instance of n-type material 353 and p-type material 354 is shown, thermoelectric device 510 may include numerous layers of p-type and n-type semiconductor elements. Node 350, node 360, and node 362 are electrically conductive and thermally conductive elements. Therefore in some embodiments, node 350, node 260, and node 362 are metallic. Node 350 electrically interconnects n-type material 353 and p-type material 354. Node 360 is electrically isolated from node 362 by insulating material 356. N-type material 353 is also electrically isolated from p-type material 354 by insulating material 356.

When a heat source is provided, thermoelectric device 510 converts thermal energy to electrical energy. For example, when the heat source is applied near node 350, heat flows into node 350. The increasing temperature of node 350 drives electrons in the n-type material 352 toward the cooler node 360, creating a current IL. Holes in the p-type material 354 flow in the direction of the current. In this manner, thermal energy from the heat source is converted into electrical energy.

The electrical potential generated by thermoelectric device 510 may be less than the voltage supplied to logic and clocking 510, eFuse system 100, etc. by a power supply associated with tamper resistant electronic system 500. Therefore it may be anticipated that the current passing though eFuse link 202 necessary for effective programming will be greater that the current passing though eFuse 602 necessary for effective programming.

Figure 8:
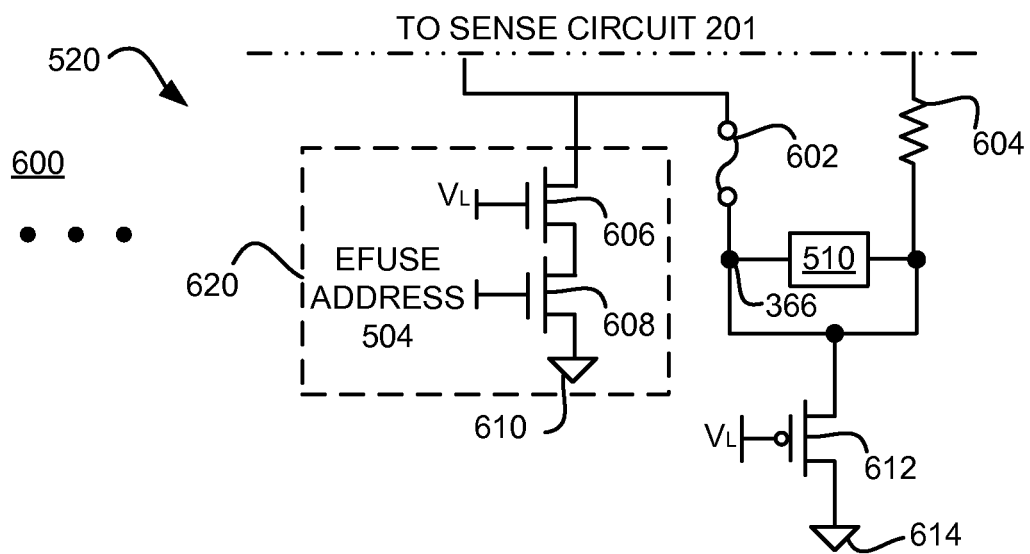
FIG. 8 depicts a thermo eFuse system according to embodiments of the present invention.

FIG. 8 depicts a thermo eFuse system 520 according to embodiments of the present invention. Thermo eFuse system 520 is a device that includes a plurality of thermo eFuses 602 that may be programmed using the electrical potential of thermoelectric device 510.

eFuse system 520 includes thermo eFuse circuit 600. Thermo eFuse circuit 600 includes blow circuitry 620, thermo eFuse 602, reference resistor 604, NFET 612, and ground 614. Various instances of blow circuitry 620, thermo eFuse 602, reference resistor 604, NFET 612, and/or ground 614 may be included in eFuse circuit 600 resulting in a plurality of thermo eFuses 602 that may be individually addressed, via thermo eFuse address 504, and programmed using the electrical potential of thermoelectric device 510.

The process of blowing thermo eFuse 602 is begins when thermoelectric device 510 generates an adequate electric potential for programming thermo eFuse 602. For example, electronic system is inserted into a reflow oven wherein thermoelectric device converts thermal energy into electrical energy as is described herein. In various embodiments, a particular thermoelectric device 510 is chosen or designed based upon an electric potential necessary to program thermo eFuse(s) 602. In other embodiments, thermo eFuse(s) 602 are chosen or designed based upon the anticipated generated electric potential of a particular thermoelectric device 510.

The state of THERMO EFUSE ADDRESS 504 is determined and held. The VL signal begins to rise as the electrical potential generated by thermoelectric device 510 approaches VL. VL is the electrical potential generated from thermoelectric device 510 that is needed to produce a current IL that is adequate to program a thermo eFuse 602. If VL is high and if THERMO EFUSE ADDRESS 504 is also high, a '1' is passed to NFETs 606 and 608. Upon receipt of a '1', NFETs 606 and 608 are activated resulting in a path to ground 610 from output 366 through thermo eFuse 602.

Thermo eFuse 602 is generally designed such that a current IL, generated by thermoelectric device 510, passing from output 366 though thermo eFuse 602 over a specified amount of time causes thermo eFuse 602 to blow (i.e., rupture, electrical migration of silicide, etc.) and become highly resistive as compared to the previous unblown state of thermo eFuse 602.

As the temperature differential within thermoelectric device 510 decreases the electrical potential generated by thermoelectric device 510 decreases and VL begins to fall. As VL falls, the path from output 366 to ground 610 closes. Further, when VL is low the '0' is inverted and a '1' is passed to NFET 612. Upon receipt of a '1', NFET 612 is activated resulting in a path to ground 614 from output 366.

The process of sensing whether one or more thermo eFuses 602 has been blown may begin when tamper resistant electronic system 500 is initialized, started, and/or when power is supplied to tamper resistant electronic system 500, logic and clocking 530, or sense circuit 201, etc.

Similar to FIG. 5, SENSE ENABLE goes high and is held. SENSE ENABLE generally is a sense enable signal allowing sense circuitry 201 to begin sensing whether thermo eFuse 602 has or has not been blown.

SIG DEV rises activating NFETs 211 and 222 resulting in current through the two paths of the circuit. One path is through node 207, PFET 210, NFETs 211 and 212, thermo eFuse 602, NFET 612, and finally to ground 614. The other path is through node 209, PFET 221, NFETs 222 and 223, reference resistor 604, NFET 612, and finally to ground 614.

The next step of sensing whether one or more thermo eFuses 602 has been blown occurs when FSET P and FSET N become active. This results in the voltage of node 241 and the voltage of node 242 to stabilize depending on the difference of resistance magnitudes of reference resistor 604 and thermo eFuse 602. If thermo eFuse 602 has not been blown, the resistance of thermo eFuse 602 is less than the resistance of reference resistor 604. This causes a lesser voltage at node 241 than the voltage at node 242. If thermo eFuse 602 has been blown, the voltage at node 241 is greater than the voltage at node 242.

FSET P and FSET N become fully active, thereby activating PFET 219 and NFET 220 and cross coupled inverter latch 215. Cross coupled inverter latch 218 generally amplifies the voltage difference between the voltage at node 241 and the voltage at node 242 to provide for more robust sensing capability.

PRECHARGE switches high from a '0' to a '1' deactivating PFETs 210 and 221. In window 6, of FIG. 5, SIG DEV switches low from a '1' to a '0' deactivating NFETs 211 and 222. Cross coupled inverter latch 218 becomes isolated from the outside influence of the two paths (i.e., node 207 through thermo eFuse 602, and node 209 through reference resistor 604). After SIG DEV switches low, from '1' to '0', the TRUE and COMP outputs reflect the state of cross coupled inverter latch 218. For example, when thermo eFuse 602 has been blown and cross coupled inverter latch 218 has been activated, a '1' is passed to inverter 213 and a '0' is passed to inverter 224. Inverter 213 and 224 then invert the signals, thereby resulting in COMP being low '0' and TRUE being high '1'. A separate latch (i.e., shadow latch), stores the value of TRUE and COMP and is scannable (i.e., a latch part of a JTAG boundary scan chain, LSSD scan chain, etc).

Finally, THERMO EFUSE ADDRESS 504 is incremented so that a next thermo eFuse 602 may be programmed when thermoelectric device 510 generates an adequate electric potential.

Figure 9:
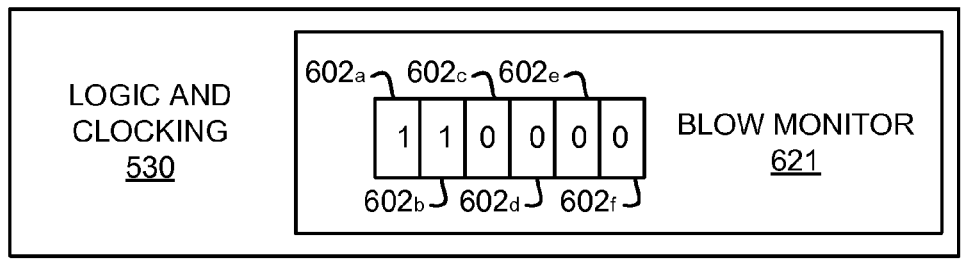
FIG. 9 depicts a thermo eFuse blow monitor according to embodiments of the present invention.

FIG. 9 depicts a thermo eFuse blow monitor 621 according to embodiments of the present invention. The number of eFuses 602 that are programmed may be determined. For example, thermo eFuse blow monitor 621 may scan the separate latch that stores the value of TRUE and COMP. The scan may indicate a particular number of thermo eFuses 602 have been programmed. In this manner, thermo eFuse system 520 may be utilized as a counter.

Thermo eFuse blow monitor 621 includes a number of latches, registers, storage units, or the like that are individually associated with particular thermo eFuse 602 to store an indication whether the thermo eFuse 602 has or has not been programmed. For example, a first register associated with thermo eFuse 602a stores a "1" indicating that thermo eFuse 602a has been programmed. A second register associated with thermo eFuse 602b also stores a "1" indicating that thermo eFuse 602b has been programmed. A third through sixth registers associated with thermo eFuses 602c-602f, respectively, store a "0" indicating that thermo eFuses 602c-602f have not been programmed. Therefore, in this particular example, it is determined that two of six thermo eFuses 602 have been programmed. This bit line blow pattern may be read by an external testing device (not shown) or stored in the tamper resistant electronic system 500 for later use.

Thermoelectric device 510 and thermo eFuse system 520 may be configured so that thermo eFuses 602 blow at specific temperatures. For example, when tamper resistant electronic system 500 is being manufactured it is known that the tamper resistant electronic system 500 will undergo operations at high temperatures. For instance, during solder reflow processes, tamper resistant electronic system 500 may be subjected to a peak temperature (a common peak temperature is 20-40° C. above a liquidus solder temperature). In various embodiments, thermoelectric device 510 is configured so that it generates an adequate electric current to effectively program a thermo eFuse 602 when exposed to the peak temperature.

The manufacturer of tamper resistant electronic system 500 may expect that tamper resistant electronic system 500 and/or a component of tamper resistant electronic system 500 will be subject the peak temperature a specific number of instances. For example, the manufacturer may expect that tamper resistant electronic system 500 will be subject to the peak temperature only three instances. The manufacturer knows that tamper resistant electronic system 500 will be subject to the peak temperature at least once during the initial installation during a solder reflow process. However, the manufacturer may allow, desire, or expect that tamper resistant electronic system 500 may be subject to the peak temperature a second and third instance. For example, the manufacturer may allow for one rework (rework would require a heating stage for removal and another heating stage for re-installation).

The number of thermo eFuses 602 that are programmed may be compared against a threshold number. In certain embodiments, the threshold number is the number of instances that the manufacturer of tamper resistant electronic system 500 expects that tamper resistant electronic system 500 and/or a component of tamper resistant electronic system 500 will be subject to a given temperature (e.g., peak temperature, solder reflow temperature, etc.). If the number of thermo eFuses 602 that are programmed is greater than the threshold number, logic and clocking 530 sends the ENABLE FS 102 to allow for the programming of one or more eFuse links 202 in order to enable, disable, or otherwise change the functionality of tamper resistant electronic system 500. In some embodiments, the one or more eFuse links 202 are automatically programmed when logic and clocking 530 sends the ENABLE FS 102.

Figure 10:
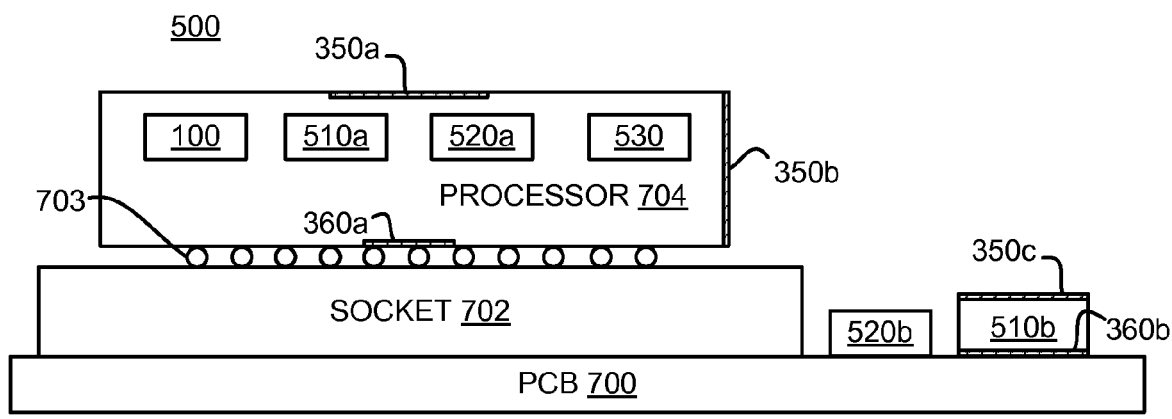
FIG. 10 depicts a tamper resistant processor that includes an eFuse system, a thermoelectric device, logic and clocking, and a thermo eFuse system according to embodiments of the present invention.

FIG. 10 depicts an exemplary tamper resistant electronic system 500, according to embodiments of the present invention. Exemplary tamper resistant electronic system 500 includes tamper resistant processor 704, eFuse system 100, thermoelectric device 510, thermo eFuse system 520, and logic and clocking 530.

One or more tamper resistant processors 704 may be connected to a printed circuit board 700 via one or more sockets 702. Tamper resistant processors 704 may be attached to socket 702 via solder balls 703. Solder balls 703 can be placed manually or with automated equipment. Solder balls 703 may be held in place with a tacky flux until soldering occurs. Tamper resistant processor 704 is placed on PCB 700 or socket 702 which typically have copper pads in a pattern that matches the solder balls 703. The tamper resistant electronic system 500 is then heated, either in a reflow oven or by an infrared heater, causing the solder balls 703 to melt. Tamper resistant electronic system 500 is subsequently cooled and solder 703 solidifies thereby connecting tamper resistant processor 704 to socket 702. The reflow temperature is generally higher than the operating temperature of tamper resistant electronic system 500. In some embodiments, tamper resistant electronic system 500 may need to be exposed to a peak temperature in order for solder 703 to reach a solder reflow temperature.

In various embodiments, eFuse system 100, thermoelectric device 510, thermo eFuse system 520, and logic and clocking 530 are included within tamper resistant processor 704. In other embodiments, one or more of eFuse system 100, thermoelectric device 510, thermo eFuse system 520, and logic and clocking 530 may be included within a different electronic system. For instance, thermoelectric device 510 and thermo eFuse system 520 may be included in a printed circuit board assembly 700 (i.e., thermoelectric device 510b and thermo eFuse system 520b take the place of thermoelectric device 510a and thermo eFuse system 520a). Further, thermoelectric device 510b and thermo eFuse system 520b may be associated with multiple electronic components (e.g., multiple tamper resistant processors 704, etc.).

In some embodiments, thermoelectric device 510 and thermo eFuse system 520 are configured so that thermo eFuses 602 blow when solder 703 reaches a solder reflow temperature. For example, node 350 may be placed on an outer surface nearest a heating source. In this manner, node 350 may quickly warm. For example, node 350 may be on the top of tamper resistant processor 704 or on the upper surface of a discrete surface mount thermoelectric device 510. Node 360 may be placed on an internal surface furthest from the heating source. For example, node 360 may be on the bottom of tamper resistant processor 704 or on the underside of a discrete surface mount thermoelectric device 510. In other words, node 360 is insulated from the heating source. Node 360 will therefore stay cooler than node 350 for at least some time (until thermal equilibrium). Thermoelectric device 510 device may take advantage of this temperature differential to generate an electric current adequate to blow a thermo eFuse 602.

It may be expected that tamper resistant processor 704 will be subject to temperatures necessary for solder 703 to reach a solder reflow temperature three separate instances. Tamper resistant processor 704 is first subject to these temperatures when tamper resistant processor 704 is attached or otherwise installed to socket 702. Because of the heating involved during this process, it is expected that a first thermo eFuse 602 will blow.

Tamper resistant processor 704 may also be configured to allow for a single rework. Rework processes relate to refinishing operation or repair of an electronic printed circuit board assembly. To rework tamper resistant processor 704, it is again heated so that solder 703 may again become liquid thus enabling tamper resistant processor 704 to be removed from socket 702. Once removed, tamper resistant processor 704 may be reworked. The process to re-install tamper resistant processor 704 may then be repeated. During these processes, therefore, it is expected that a second thermo eFuse 602 and a third thermo eFuse 602 will have blown.

In the present example, the manufacture desires that tamper resistant processor 704 is only able to be reworked once, so the manufacture scraps the tamper resistant processor 704 if it needs further rework. However, if an unauthorized entity puts tamper resistant processor 704 through additional rework process, more thermo eFuses 602 will be blown and functionality of tamper resistant processor 704 is disabled or modified. This may occur if tamper resistant processor 704 is obtained by an unintended entity, reworked, and reinstalled for use in a non approved usage. In other words, functionality of the tamper resistant processor 704 is disabled or modified when it is tampered in an unanticipated manner.

The actual number of thermo eFuses 602 that are programmed may be compared against a threshold. In this example, the threshold number is three since it is expected that tamper resistant processor 704 will be subject to temperatures necessary for solder 703 to reach the reflow temperature in three instances (i.e., once during first installation and twice during the one allowed rework). The comparison of the actual number of thermo eFuses 602 that are blown versus the threshold may be done, for example, when tamper resistant processor 704 is subsequently powered on or is otherwise initialized. The comparison of the actual number of thermo eFuses 602 that are blown versus the threshold is preferably done prior to tamper resistant processor 704 doing functional work.

If the number of thermo eFuses 602 that are programmed is greater than the threshold, logic and clocking 530 sends ENABLE FS 102 to enable the programming one or more eFuse links 202 in order enable, disable, or otherwise change the functionality of tamper resistant processor 704. In some embodiments, eFuse system 100 automatically programs one or more eFuse links 202 when in receipt of ENABLE FS 102. In certain embodiments, the programming of an eFuse link 202 disables tamper resistant processor 704. In other embodiments, the programming of the eFuse link 202 forces tamper resistant processor 704 into an unauthorized mode whereby certain functionalities are disabled. In other embodiments, programming of the eFuse link 202 enables destruct functionality thereby putting tamper resistant processor 704 into a destruct mode (e.g., tamper resistant processor 704 deliberately issues false commands, etc.).

Figure 11:
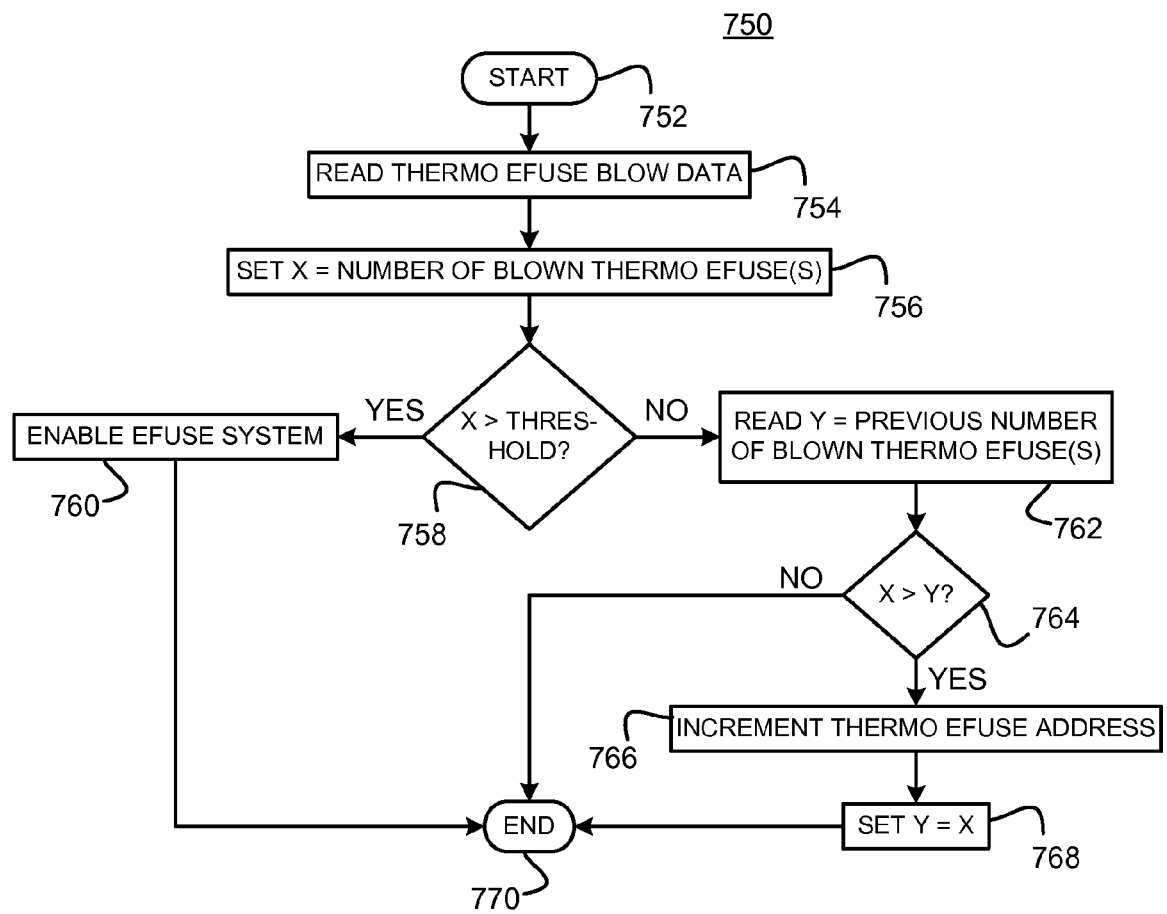
FIG. 11 depicts a method for managing the programming of an eFuse system in a multiple eFuse environment, according to embodiments of the present invention.

FIG. 11 depicts a method 750 for managing the programming of eFuse system 100 in a multiple eFuse system environment (e.g., eFuse system 100 and thermo eFuse system 520, etc.), according to embodiments of the present invention. Method 750 may be utilized, for example, by logic and clocking 530. Method 750 begins at block 752. Thermo eFuse blow data is read (block 754). For example, logic and clocking 530 reads the bit line blow pattern of thermo blow monitor 621. In general, by reading the thermo eFuse blow data, logic and clocking 530 is determining the number of thermo eFuses 602 that are programmed.

Method 750 continues by setting a variable "X" equal to the number of blown thermo eFuses 602 (block 756) and determining whether "X" is greater than a threshold (block 758). For example, logic and clocking 530 compares the actual number of blown thermo eFuses 602 to the threshold. The threshold may be pre set, predetermined, or is otherwise set by a device seller that intends for device functionally to be enabled, disabled, or changed upon the programming of eFuse system 100.

If the actual number of blown thermo eFuses 602 is greater than the threshold, eFuse system 100 is enabled (block 760). For example, logic and clocking 20 provides an ENABLE FS 102 signal that is used to place eFuse system 100 into a mode where eFuse links 202 can be blown. After eFuse system 100 is enabled, method 750 ends at block 770.

If the actual number of blown thermo eFuses 602 is less than the threshold, it is determined if a new thermo eFuse 602 has been blown. For example, the number of previously blown thermo eFuses 602 (block 762) is compared to the current number of blown thermo eFuses 602 (block 764). If the number of previously blown thermo eFuses 602 is not greater than the current number of blown thermo eFuses 602, method 750 ends at block 770. If the number of previously blown thermo eFuses 602 is greater than the current number of blown thermo eFuses 602, ADDR ENABLE is incremented (block 766). For example, logic and clocking 530 sets a new thermo eFuse 602 address so that an unblown thermo eFuse 602 may be blown in a subsequent iteration. Finally, the number of previously blown thermo eFuses 602 is set to the current number of blown thermo eFuses 602 (block 768) and method 750 ends at block 770.

In various embodiments, one or more eFuse links 202 within eFuse system 100 are automatically programmed when eFuse system 100 receives ENABLE FS 102 signal.

Figure 12:
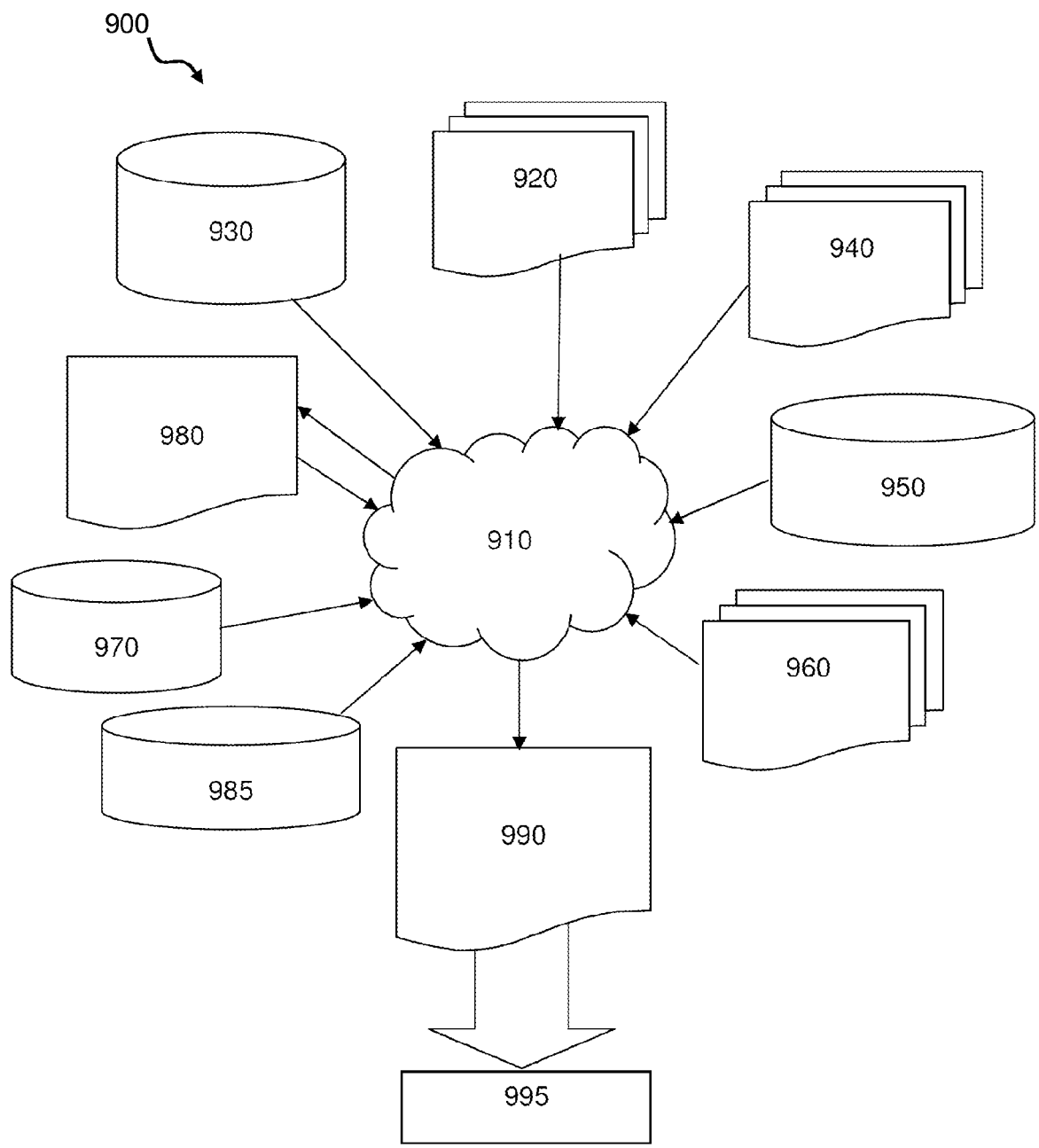
FIG. 12 depicts a flow diagram of a design process used in circuit or semiconductor design, manufacture, and/or test.
Figure 13:
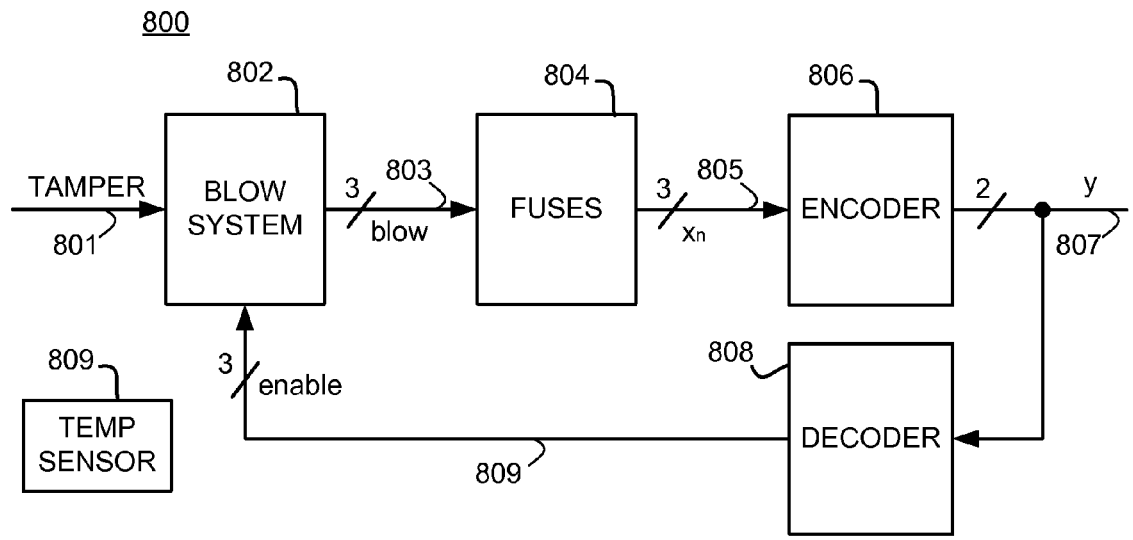
FIG. 13 depicts a tamper resistant electronic system in a single eFuse system environment, according to an embodiment of the present invention. The tamper resistant electronic system further includes an eFuse blow system, an encoder, and a decoder according to embodiments of the present invention.

FIG. 12 shows a block diagram of an exemplary design flow 900 used for example, in semiconductor integrated circuit (IC) logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 6-10, 13 and 15-17.

The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g., a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer.

When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 6-10, 13, and 15-17. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 6-10, 13 and 15-17 to generate a Netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc.

One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures).

Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 6-10, 13 and 15-17. In one embodiment, design structure 990 may comprise a compiled, executable HDL simulation model that functionally simulates the devices shown in FIGS. 6-10, 13 and 15-17.

Design structure 990 may also employ a data format used for the exchange of layout data of integrated circuits and/or symbolic data format (e.g., information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 6-10, 13 and 15-17.

Design structure 990 may then proceed to a stage 995 where, for example, design structure 990: proceeds to tape-out, is released to manufacturing, is released to a mask house, is sent to another design house, is sent back to the customer, etc.

As described above, exemplary tamper resistant electronic system 500 includes multiple eFuse systems (an eFuse system 100 and a thermo eFuse system 520). However in FIG. 13, a tamper resistant electronic system 800 includes a single eFuse system 804, an eFuse blow system 802, an encoder 806, and a decoder 808 according to embodiments of the present invention. In certain embodiments, tamper resistant electronic system 800 also includes a temperature sensor 809. For example, when thermoelectric device 510 is not utilized by tamper resistant electronic system 800, temperature sensor 809 may be utilized.

In certain embodiments, the single eFuse system 804 may be eFuse system 100. In other embodiments, the single eFuse system 804 may be a thermo eFuse system 520. In other embodiments, eFuse system 804 may be one or more eFuse links that may be blown by a current.

Blow system 802 includes circuitry that blows an eFuse upon the detection of a TAMPER signal 801. TAMPER signal 801 is generated when tamper resistant electronic system 800 experiences tampering. For example, a TAMPER signal 801 may be generated by thermoelectric device 510 (i.e., ENABLE FS 102, etc.). TAMPER signal 801 may also be generated by temperature sensor 809. Temperature sensor 809 is a temperature measuring device that outputs a TAMPER signal 801 when tamper resistant electronic system 800 or when a portion of tamper resistant electronic system 800 such as a processor (not shown) reaches a threshold temperature (e.g., solder reflow temperature, etc.).

More generally, TAMPER signal 801 may be generated and/or sent by a tamper detection device that senses a tampering (e.g., physical tampering, freezing, applying out-of-spec voltages or power surges, applying unusual clock signals, inducing software errors using radiation, measuring the precise time and power requirements of certain operations, etc.).

Blow system 802 receives an enable signal 809 from decoder 808 that enables blow system 802 to blow a particular or identified eFuse. In other words, enable signal 809 identifies a particular eFuse that should be blown. Therefore even though multiple eFuses are present in eFuse system 804, only a single eFuse is blown upon the receipt of TAMPER signal 801. In the example shown in FIG. 13, there are three eFuses included in tamper resistant electronic system 800 (also see FIG. 15). Therefore, three enable signals 809 exist to identify each particular eFuse. It is to be understood that tamper resistant electronic system 800 may include less than three eFuses or more than three eFuses.

Upon the receipt of TAMPER signal 801 and a particular enable signal 809, blow system 802 blows the eFuse associated with the enable signal 809 via blow signal 803. Similar to enable signals 809 in the present example, three blow signals 803 exists each being associated with a particular enable signal 809, such that the eFuse identified by enable signal 809 may be blown as expected.

Encoder 806 receives an eFuse state signal 805 and encodes the states of the eFuses (xn) into binary numbers and outputs an output signal 807. In certain embodiments, the number of outputs (e.g., y0, y1) are minimized in order to minimize the number of required pins. Decoder 808 decodes the output signals 807 to an incremented enable signal 809. In other words, decoder 808 increments the enable 809 signal such that a next eFuse may be blown upon receiving the next TAMPER signal 801.

Figures 14, 15:
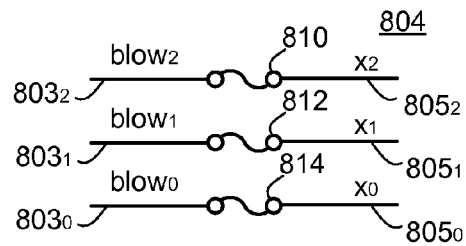
FIG. 14 depicts an eFuse blow and output diagram according to embodiments of the present invention.
FIG. 15 depicts an eFuse system according to embodiments of the present invention.

FIG. 14 depicts an exemplary eFuse blow and output diagram according to embodiments of the present invention. The blow diagram describes how, for example, encoder 806 may encode the states of the eFuses (xn) into binary number outputs (y0 & y1). When x2 is blown (i.e., high), outputs y0 and y1 are high. When x2 is not blown and when x1 is blown, output y0 is low and output y1 is high. When x2 and x1 are not blown and when x0 is blown, output y0 is high and output y1 is low. Finally when no eFuses are blown (x2, x1, and x0 are low), outputs y0 and y1 are low. In other embodiments, encoder 806 may encode the states of the eFuses differently.

FIG. 15 depicts an exemplary eFuse system 804 according to embodiments of the present invention. eFuse system 804 includes a plurality of eFuses 810, 812, and 814 that may be individually programmed by blow system 802 via blow signal 803. For example, eFuse 810 may be blown by blow signal 8032, eFuse 812 may be blown by blow signal 8031, and eFuse 814 may be blown by blow signal 8030. The eFuse state signal 805 indicates whether a particular eFuse is or is not blown and may be read by encoder 806. For example, eFuse state signal 8052 indicates whether eFuse 810 is or is not blown, eFuse state signal 8051 indicates whether eFuse 812 is or is not blown, and eFuse state signal 8050 indicates whether eFuse 814 is or is not blown. The eFuse system 804 shown in FIG. 15 is exemplary and therefore eFuse system 804 may differ in its implementation as shown.

Figure 16:
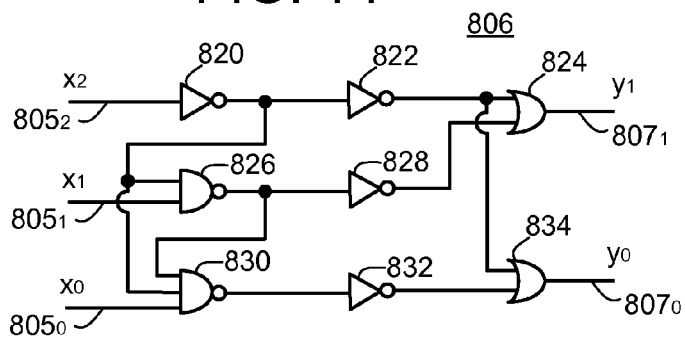
FIG. 16 depicts an encoder according to embodiments of the present invention.

FIG. 16 depicts an exemplary encoder 806 according to embodiments of the present invention. Encoder 806 may include an inverter 820, an inverter 833 an OR gate 824, an NAND gate 826, an inverter 828, an NAND gate 830, and inverter 832, and an OR gate 834. eFuse state signal 8052 is inverted by inverter 820. The output of inverter 820 is inverted by inverter 822.

The output of inverter 820 is also an input to NAND gate 826 and NAND gate 830. Further, eFuse state signal 8051 is also an input to NAND gate 826. The output of NAND gate 826 is inverted by inverter 828. The output of inverter 828 is also an input to NAND gate 830. eFuse state signal 8050 is also an input to NAND gate 830. The output of NAND gate 830 is inverted by inverter 832.

The output of inverter 822 and the output of inverter 828 are inputs to OR gate 824. The output of OR gate 824 is output signal 8071. The output of inverter 822 and the output of inverter 832 are inputs to OR gate 834. The output of OR gate 834 is output signal 8070. The encoder 806 shown in FIG. 16 is exemplary and therefore encoder 806 may differ in its implementation as shown.

Figure 17:
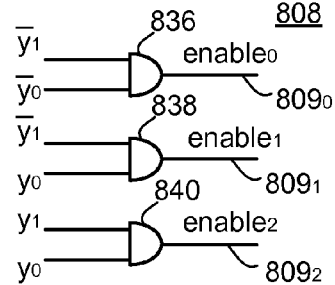
FIG. 17 depicts a decoder according to embodiments of the present invention.

FIG. 17 depicts an exemplary decoder 808 according to embodiments of the present invention. Decoder 808 may include AND gate 836, AND gate 838, and AND gate 840. The inverse of output signal 8071 and the inverse of output signal 8070 are inputs of AND gate 836. The inverse of output signal 8071 and the output signal 8070 are inputs of AND gate 838. Finally, the output signal 8071 and the output signal 8070 are inputs of AND gate 840. The output of AND gate 836 is enable signal 8090, the output of AND gate 838 is enable signal 8091, and the output of AND gate 840 is enable signal 8092. In certain embodiments, decoder 808 may be clocked to prevent a repeating loop of blowing eFuses (i.e., a new clock increment occurs before decoder 808 enables the next eFuse, etc.). In some embodiments, TAMPER signal 801 may be used as the clock. The decoder 808 shown in FIG. 17 is exemplary and therefore decoder 808 may differ in its implementation as shown.

In certain embodiments, enable signals 809 may be referred to as "one hot" enable signals. "One hot" refers to there being one and only one of the plurality of enable signals 809 being active or enabled at any given point of time. Therefore, when utilizing one hot enable signals, one and only one eFuses are enabled at any given point of time.

Figure 18:
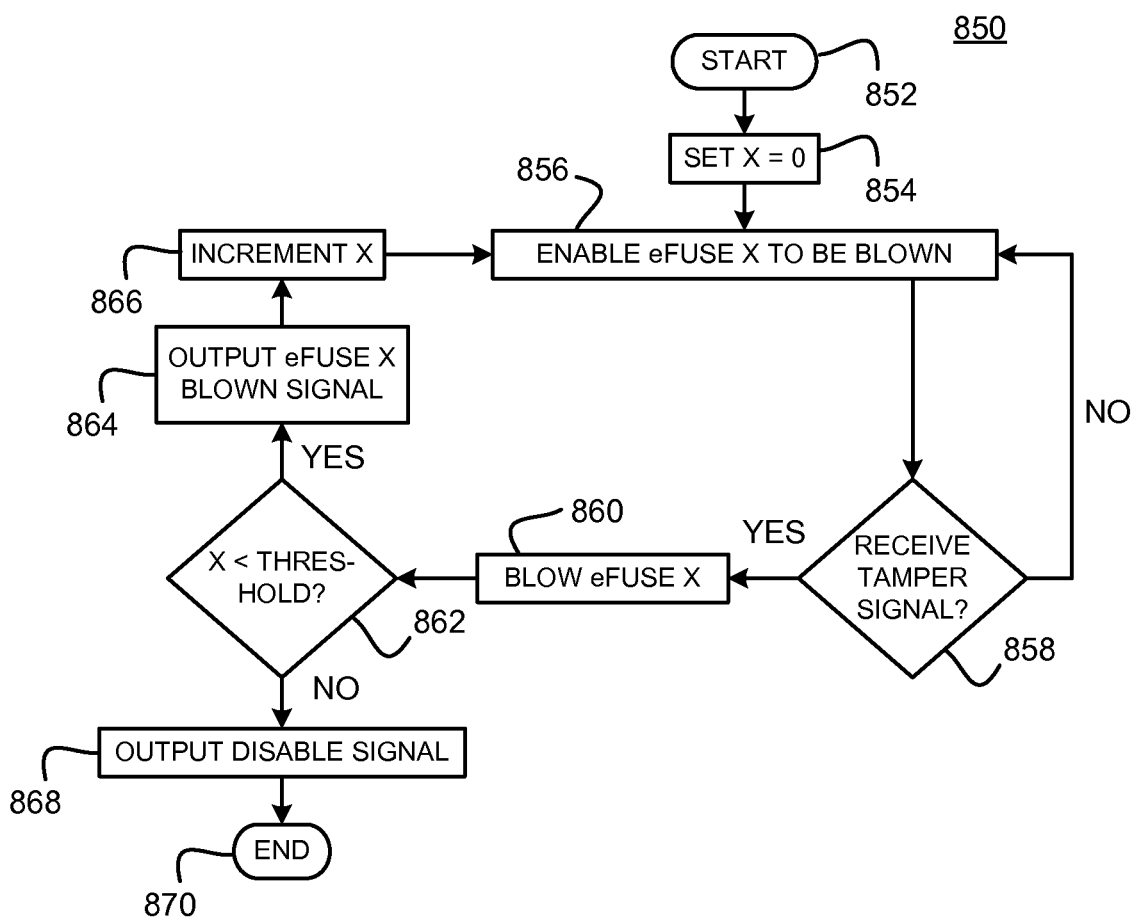
FIG. 18 depicts a method for managing the programming of an eFuse system in a single eFuse environment, according to embodiments of the present invention.

FIG. 18 depicts a method 850 for managing the programming of eFuse system 804 in a single eFuse system environment (e.g., eFuse system 804), according to embodiments of the present invention. Method 850 and/or portions of method 850 may be utilized by tamper resistant electronic device 800 or one or more components of tamper resistant electronic device 800. Method 850 begins at block 852. A variable X is set to zero (block 854). eFuse X is enabled to be blown (block 856). For example, decoder 808 sends a one hot enable signal indicating that eFuse 814 should be blown.

Upon the receipt of a TAMPER signal 801 (block 858), eFuse X is blown (block 860). For example, thermoelectric device 510 or temperature sensor 809 sends a TAMPER signal 801 to blow system 802, and because eFuse 814 is enabled, eFuse 814 is blown by blow system 802.

It is determined whether X is less than a threshold number (block 862). For example, the threshold number may be 3 which would allow for tamper resistant electronic device 800 to go through a manufacturing, rework removal, and rework installation stage as described above. If X is greater than the threshold number, a disable tamper resistant electronic device signal is outputted (block 868). For example, output 8070 and 8071 indicate that functionality of tamper resistant electronic device 800 should be disabled. In certain embodiments, the threshold number is the number of anticipated acceptable tamper events.

If X is less than the threshold number, an eFuse X is blown signal is outputted (block 864). For example, output 8070 and 8071 indicate that eFuse 814 has been blown. The variable X is incremented (block 866) to enable a next eFuse to be blown (block 856). For example, decoder 808 sends a one hot enable signal indicating that eFuse 812 should be blown. Method 850 ends at block 870.

In the above description reference was made to various embodiments of the invention. However, it should be understood that the invention is not limited to specific described embodiments. Instead, any combination of the following features and elements, whether related to different embodiments or not, is contemplated to implement and practice the invention. The following aspects, features, embodiments and advantages are merely illustrative and are not considered elements or limitations of the appended claims except where explicitly recited in a claim(s). Likewise, reference to the "invention" shall not be construed as a generalization of any inventive subject matter disclosed herein and shall not be considered to be an element or limitation of the appended claims except where explicitly recited in a claim(s).

What is claimed is:

1. A tamper resistant electronic system comprising:
   a thermoelectric device that converts thermal energy supplied from a heat source external to the tamper resistant electronic system to electrical energy to program one or more thermo electronic fuses (eFuses);
   a thermo eFuse blow monitor that determines the number of programmed thermo eFuses; and
   an eFuse system comprising one or more eFuse links, the eFuse system associated with the thermo eFuse blow monitor that is enabled if the number of programmed thermo eFuses exceeds a threshold, wherein the number of programmed thermo eFuses is indicative of whether the electronic system has been tampered with and is a threshold condition of programming one or more eFuse links.

2. The tamper resistant electronic system of claim 1 wherein an eFuse link within the eFuse system is programmed with electrical energy supplied by the tamper resistant electronic system power supply.

3. The tamper resistant electronic system of claim 2 wherein functionality of the tamper resistant electronic system is disabled if a threshold number of eFuse links within the eFuse system are programmed.

4. The tamper resistant electronic system of claim 2 wherein destruct functionality of the tamper resistant electronic system is enabled if a threshold number of eFuse links within the eFuse system are programmed.

5. The tamper resistant electronic system of claim 1 wherein the heat source external to the tamper resistant electronic system is a solder reflow oven and wherein the thermoelectric device utilizes a temperature differential between a temperature of the solder reflow oven and a temperature of the thermoelectric device to program the one or more thermo eFuses.

6. The tamper resistant electronic system of claim 1 wherein the thermoelectric device programs the thermo eFuse if the thermoelectric device is exposed to a temperature greater than or equal to a solder reflow temperature.

7. The tamper resistant electronic system of claim 6 wherein a sense circuit senses whether a thermo eFuse has been programmed during initialization of the tamper resistant electronic system.

8. A method for managing the programming an eFuse system within a tamper resistant electronic system comprising:
   comparing a number of programmed thermo eFuses within a thermo eFuse system to a threshold, the thermo eFuses programmed by a thermoelectric device that converts thermal energy supplied from a heat source external to the tamper resistant electronic system to electrical energy;
   if the number of programmed thermo eFuses is greater than the threshold, enabling programming of one or more eFuse links of the eFuse system;
   wherein the number of programmed thermo eFuses is indicative of whether an electronic system has been tampered with and is a threshold condition of programming one or more eFuse links.

9. The method of claim 8 further comprising:
   comparing the number of programmed thermo eFuses to a previous number of programmed thermo eFuses.

10. The method of claim 9 further comprising:
if the number of programmed thermo eFuses has increased relative to the previous number of programmed thermo eFuses, enabling programming of the one or more eFuse links of eFuse system.

11. The method of claim 8 further comprising:
disabling functionality of a tamper resistant electronic system by programming the one or more eFuse links of eFuse system.

12. The method of claim 8 further comprising:
enabling self destruct functionality of a tamper resistant electronic system by programming the one or more eFuse links of eFuse system.

13. The method of claim 8 wherein the one or more eFuse links of the eFuse system is programmed with electrical energy supplied by a tamper resistant electronic system power supply.

14. The method of claim 8 wherein the heat source external to the eFuse system is a solder reflow oven.

15. The method of claim 14 wherein the thermoelectric device utilizes a temperature differential between a temperature of the solder reflow oven and a temperature of the thermoelectric device to program the thermo eFuses.

16. The method of claim 14 further comprising:
programming, with the thermoelectric device, a particular thermo eFuse if the thermoelectric device is exposed to a temperature greater than or equal to a solder reflow temperature; and
sensing, with a sense circuit, whether the particular thermo eFuse has been programmed during initialization of a tamper resistant electronic system.

17. A design structure tangibly embodied in a machine readable medium for designing, manufacturing, or testing an integrated circuit, the design structure comprising a tamper resistant electronic system, the tamper resistant electronic system comprising:
a thermoelectric device that converts thermal energy supplied from a heat source external to the tamper resistant electronic system to electrical energy to program one or more thermo electronic fuses (eFuses);
a thermo eFuse blow monitor that determines the number of programmed thermo eFuses; and
an eFuse system comprising one or more eFuse links, the eFuse system associated with the thermo eFuse blow monitor that is enabled if the number of programmed thermo eFuses exceeds a threshold, wherein the number of programmed thermo eFuses is indicative of whether an electronic system has been tampered with and is a threshold condition of programming one or more eFuse links.

18. The design structure of claim 17, wherein the design structure comprises a netlist.

19. The design structure of claim 17, wherein the design structure resides on storage medium as a data format used for the exchange of layout data of integrated circuits.

20. The design structure of claim 17, wherein the heat source external to the tamper resistant electronic system is a solder reflow oven and wherein the thermoelectric device utilizes a temperature differential between a temperature of the solder reflow oven and a temperature of the thermoelectric device to program the one or more thermo eFuses.

* * * * *